United States Patent [19]

Inaba et al.

[11] 4,342,012

[45] Jul. 27, 1982

[54] SURFACE ACOUSTIC WAVE DEVICE

[75] Inventors: Ritsuo Inaba, Hirakata; Kiyotaka Wasa, Nara, both of Japan

[73] Assignee: Matsushita Electric Industrial Co., Ltd., Osaka, Japan

[21] Appl. No.: 235,751

[22] Filed: Feb. 18, 1981

[30] Foreign Application Priority Data

Feb. 19, 1980 [JP] Japan .................................. 55/20267

[51] Int. Cl.$^3$ ........................ H03H 9/42; H03H 9/64; H03B 5/32; H01L 41/18
[52] U.S. Cl. .................................... 333/155; 333/193; 331/107 A
[58] Field of Search ................................ 333/150–155, 333/193–196; 310/313 R, 313 A, 313 B, 313 C, 313 D; 313/107 A

[56] References Cited

U.S. PATENT DOCUMENTS

| 3,786,373 | 1/1974 | Schulz et al. ........................ 333/155 |
| 3,965,444 | 6/1976 | Willingham et al. ................ 333/155 |
| 4,245,201 | 1/1981 | Takahashi et al. .................. 333/194 |

Primary Examiner—Marvin L. Nussbaum
Attorney, Agent, or Firm—Burgess, Ryan and Wayne

[57] ABSTRACT

A surface acoustic wave device in which an X-cut LiTaO$_3$ single crystal substrate has its one major surface coated with a SiO$_2$ film and the direction of propagation of surface acoustic waves is selected between 80° and 180° measured from the Y-axis toward the Z-axis. The surface acoustic wave devices in accordance with the present invention has an extremely low temperature coefficient change and a high electro-mechanical coupling coefficient, exhibits a higher degree of both short- and long-term stability, and can suppress the generation of unwanted waves to a minimum or negligible degree.

11 Claims, 12 Drawing Figures

SURFACE ACOUSTIC WAVE DEVICE

BACKGROUND OF THE INVENTION

The present invention relates to surface acoustic wave devices and has for its object to provide surface acoustic wave devices which can substantially overcome the problems encountered in the prior art surface acoustic wave devices, and have zero temperature coefficient and a high electro-mechanical coupling coefficient.

For most applications of surface acoustic wave devices, the most important factor is the attainment of a sufficiently higher degree of temperature stabilization of delay time. An ST-cut quartz is the most typical surface acoustic wave material with a low temperature coefficient. In addition, the crystals of $TeO_2$ and $AlPO_4$ have the zero temperature coefficient. However, these ST-cut quartz, $TeO_2$ and $AlPO_4$ have an extremely small electro-mechanical coupling coefficient. Therefore, there has been an ever increasing demand for surface acoustic wave device materials which have not only the zero temperature coefficient but also a large or high electro-mechanical coupling coefficient.

To this end, extensive studies and experiments have been made on the composite surface acoustic wave device materials consisting of two materials. For instance, there have been devised and demonstrated the zero temperature coefficient surface acoustic wave devices comprising in combination a material such as $LiNbO_3$ or $LiTaO_3$ which has both a high temperature coefficient and a high coupling coefficient and a material such as $SiO_2$ which has a negative temperature coefficient. (See "STABILITY OF SAW CONTROLLED OSCILLATORS", T. E. Parker et al., 1975 Ultrasonics Symposium Proceedings IEEE Cat No. 75 CHO 994-4SU and U.S. Pat. No. 3,965,444, granted to C. B. Willingham et al.)

FIG. 1 is a graph of the temperature coefficient versus h.k for a Y-cut lithium tantalate substrate ($LiTaO_3$) when the surface acoustic waves are propagated in the Z-direction. (FIG. 1 corresponds to FIG. 4 in the accompanying drawings of U.S. Pat. No. 3,965,444.) The product h.k (h is film thickness of the silicon dioxide ($SiO_2$) layer and k is equal to $2\pi/\lambda$ where $\lambda$ is acoustic wavelength) is plotted along the abscissa while the temperature coefficient of delay time is plotted along the ordinate.

FIG. 2 shows the temperature dependence of an $SiO_2/LiTaO_3$ oscillator compared to an ST-quartz oscillator. (FIG. 2 corresponds to FIG. 5 of T. E. Parker et al.) The $SiO_2/LiTaO_3$ oscillator's frequency is 399.82 MHz while the ST-quartz oscillator's frequency is 310.7 MHz.

However, the surface acoustic wave device of the type described above; that is, the device consisting of the combination of a Y-cut $LiTaO_3$ upon which the surface acoustic waves are propagated in the Z-direction and $SiO_2$ have two major drawbacks or problems to be described below. Firstly, the thickness of a $SiO_2$ film must be made from 40 to 50% of an acoustic wavelength. As a result, the thermal distortions due to the difference in coefficient of thermal expansion between the $SiO_2$ film and the $LiTaO_3$ substrate become very pronounced. (See "PSG/LiTaO$_3$(x-112°)", Ebata et al., The Proceedings Of The Institute Of Electronics And Communication Engineers Of Japan US-79-25, P25). Secondly, since the $SiO_2$ film is thick, unwanted waves are generated. That is, because of the double structure of $SiO_2$ and $LiTaO_3$, the waves in some mode which would not be generated on the surface of a $LiTaO_3$ substrate are generated and interfere with the desired waves.

Temperature coefficient compensated surface acoustic wave devices consisting of a Y-cut, Z-direction propagation $LiTaO_3$ substrate and a $SiO_2$ film thereon have a relatively large coupling coefficient, so that their applications are easy. However, in practice, they have not been used because of the drawbacks described above.

Even though ST-cut quartz SAW devices have a coupling coefficient which is lower by one order of magnitude than that of the above-described surface acoustic wave devices, they have found wide applications in which the attainment of temperature stability is a critical factor. In addition to the problem that ST-cut quartz has a low coupling coefficient as described previously, it has a further problem that, as seen clearly from FIG. 2, it has a zero first order temperature coefficient, but its second order temperature coefficient is high. As a consequence, even when it is used in a normal temperature range, the frequency change reaches 50 to 100 ppm, which is higher by one order of magnitude as compared with 5 ppm of AT-cut quartz. There has been a strong demand or need for surface acoustic wave devices which have a temperature coefficient comparable to that of AT-cut quartz, but so far there has not been available.

BRIEF DESCRIPTION OF THE DRAWINGS

The present invention will become more apparent from the following description of preferred embodiments thereof taken in conjunction with the accompanying drawings, in which.

DETAILED DESCRIPTION OF THE INVENTION

The present invention is based upon the discovery of surface acoustic wave materials which can substantially overcome not only two drawbacks of the prior art zero temperature coefficient surface acoustic wave materials such as ST-cut quartz; that is, (1) a low coupling coefficient and (2) a high second temperature coefficient but also drawbacks of the composite materials consisting of Y-cut and Z-direction propagation LiTaO₃ and SiO₂; that is, (1) instability and (2) the generation of unwanted waves resulting from the fact a SiO₂ film is thick.

The surface acoustic wave devices in accordance with the present invention can be applied to the bandpass filters, oscillators, delay lines and resonators, so that they may have a higher degree of temperature stability. In terms of temperature stability, the surface acoustic wave devices in accordance with the present invention are sufficiently comparable with the devices including AT-cut quartz which, at present, is considered to have the highest temperature stability.

Figure 3:
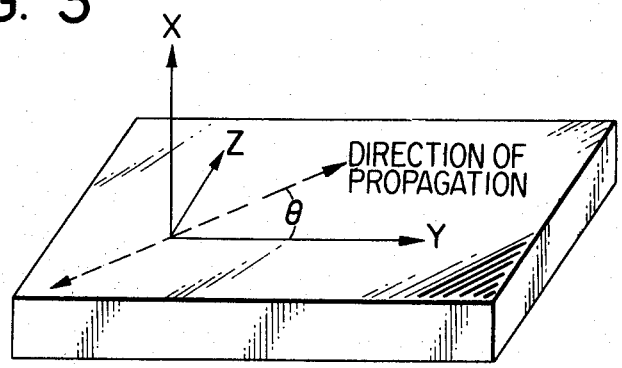
FIG. 3 is a perspective view of a surface acoustic wave material in accordance with the present invention and shows the relationship between the axes of a $LiTaO_3$ crystal and the direction in or angle at which the surface acoustic waves are propagated.

An X-cut substrate of single crystal LiTaO₃ is used as a surface acoustic wave device material with a high electro-mechanical coupling coefficient and zero temperature coefficient. A silicon oxide (SiO₂) film is deposited or otherwise formed over the surface of the substrate and the direction θ of propagation of surface acoustic waves is selected between 80° and 180° measured from the Y-axis toward the Z-axis as shown in FIG. 3. Thus a surface acoustic wave device with a zero temperature coefficient and a high coupling coefficient is provided.

Figure 4:
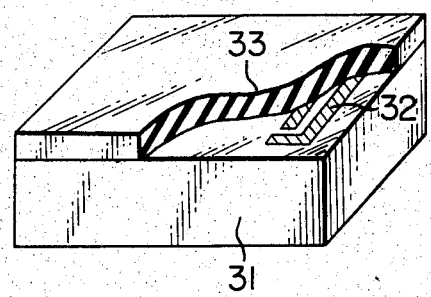
FIG. 4 is a partially cutaway perspective view of a composite surface acoustic wave device consisting of an X-cut $LiTaO_3$ substrate and a $SiO_2$ film thereon.

In FIG. 4 is shown the fundamental construction of the surface acoustic devices used in the experiments conducted by the inventors. A substrate 31 is an X-cut single crystal of LiTaO₃ and the direction θ of propagation of surface acoustic waves is selected 115° measured from the Y-axis toward the Z-axis. Laid over the substrate 31 is an interdigital electrode 32 and a SiO₂ film 33 is formed over the substrate 31 and the electrode 32 while the substrate 31 is being maintained at temperatures lower than 150° C.

Figure 5:
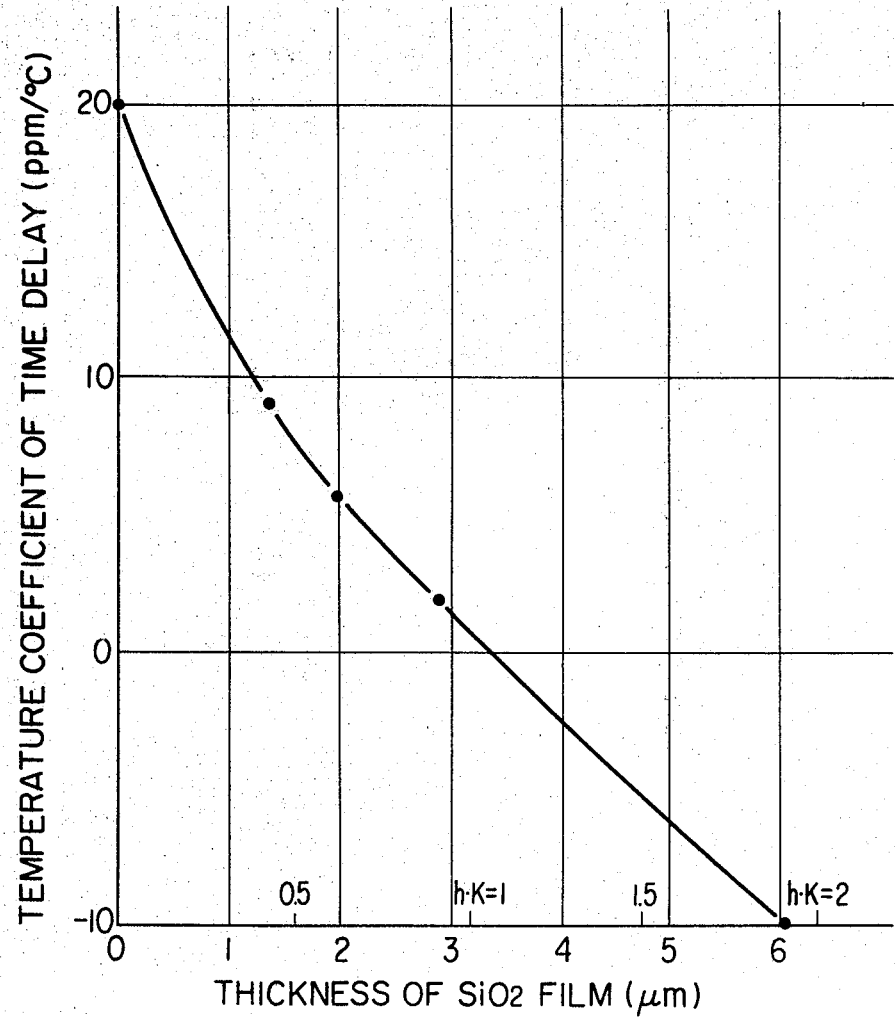
FIG. 5 is a graph showing the relationship between the temperature coefficient of time delay and thickness of the $SiO_2$ film of the device shown in FIG. 4 when the propagation direction or angle is 115°.

FIG. 5 is a graph of temperature coefficient vs. thickness of the SiO₂ film for the surface acoustic wave device shown in FIG. 4 (λ=20 micrometers). The thickness of the SiO₂ film is plotted along the abscissa while the temperature coefficient, along the ordinate. It is noted that the zero temperature coefficient can be obtained when the product h·k, where h is the thickness of the SiO₂ film and k is equal to 2π/λ where λ is acoustic wave length, is approximately unity or 1. As the direction θ of propagation of surface acoustic waves changes, the thickness of the SiO₂ film which can obtain the zero temperature coefficient varies accordingly. That is, as θ changes from 80° to 180°, the thickness of the SiO₂ film in terms of h·k varies from 0.6 to 3.0.

Figure 1:
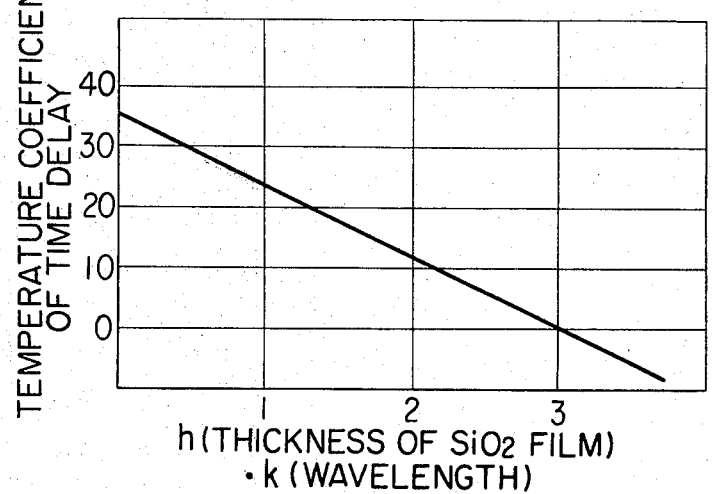
FIG. 1 is a graph showing the relationship between the temperature coefficient of delay time and the product h.k, where h is the thickness of a $SiO_2$ film and k is equal to $2\pi/\lambda$ where $\lambda$ is acoustic wave length, for a composite surface acoustic wave device consisting of a Y-cut $LiTaO_3$ substrate and a $SiO_2$ film thereon.
Figure 2:
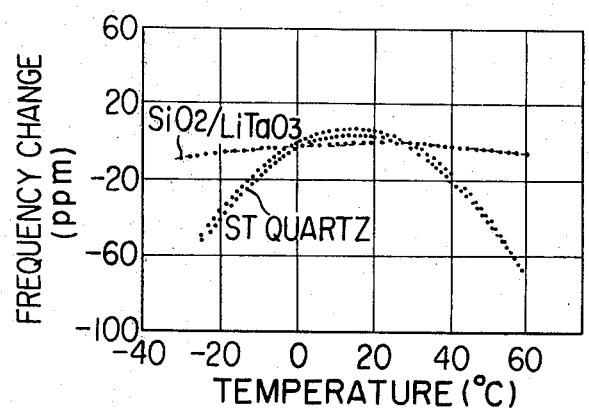
FIG. 2 is a graph showing the relationship between the oscillation frequency change and temperature for an oscillator of the type consisting of a composite surface acoustic wave device consisting of a Y-cut $LiTaO_3$ substrate and a $SiO_2$ film thereon and an ST-cut quartz.

The thickness of the SiO₂ film of the surface acoustic wave device of the present invention is reduced by about ⅓ as compared with, for example, the prior art surface acoustic wave device whose thickness of the SiO₂ film formed over the Y-cut LiTaO₃ substrate for obtaining the zero temperature coefficient, the thickness being 3 in terms of h·k as shown in FIG. 1.

The reduction in thickness of the SiO₂ film is very important in practical applications. With the prior art surface acoustic wave devices, the thermal expansion change between the substrate and the SiO₂ film is of the order of 10 ppm per 1°, but when the SiO₂ film is reduced by approximately ⅓ as in the case of the present invention, distortions between the substrate and the SiO₂ film are negligible. This fact contributes to the improvement of stability in operation of the surface acoustic wave devices.

In addition, the inventors found out that the electromechanical coupling coefficient can be improved by forming a SiO₂ film over the surface of an X-cut LiTaO₃ substrate. The electro-mechanical coupling coefficient is a measure of the capability of converting the electric energy supplied to the interdigital electrode to the energy of surface acoustic waves. The improvement on the coupling coefficient can be proved by the following experiments.

The electro-mechanical coupling coefficient can be measured in terms of an electrical impedance of the input or the interdigital electrode 32. Since the electrical energy is converted into the mechanical energy and subsequent impedance loss at the input interdigital electrode, the latter exhibits an impedance change.

Figure 6:
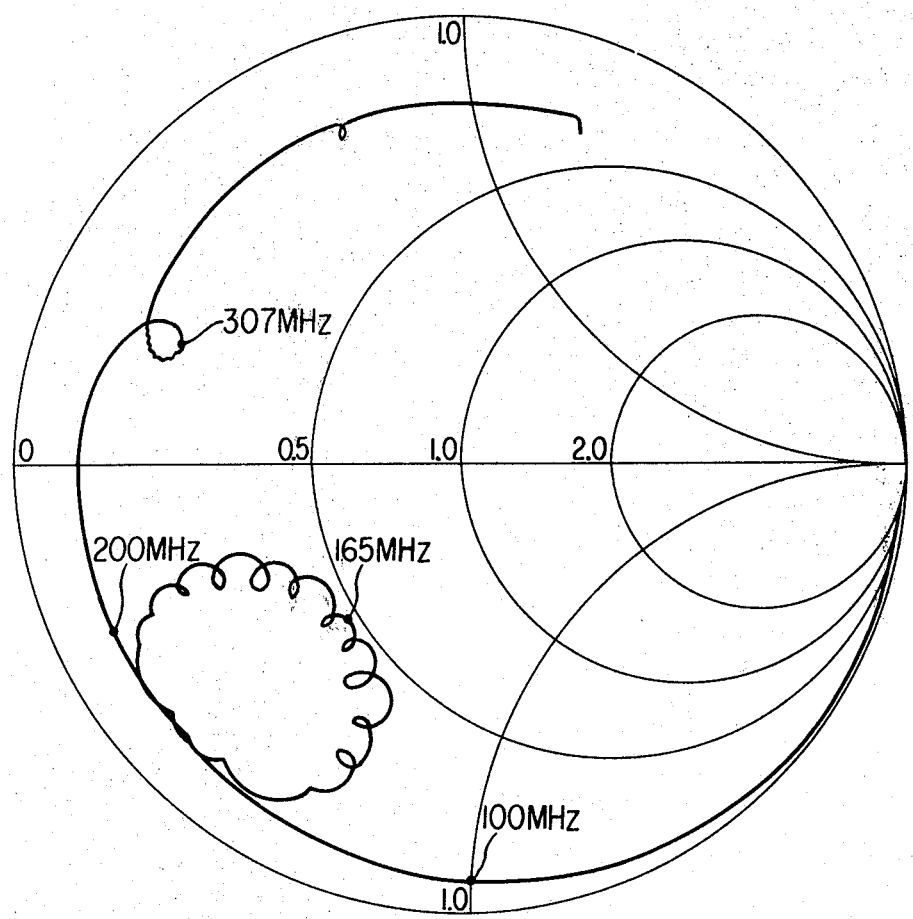
FIG. 6 is a Smith chart showing the impedance change at an interdigital electrode on one major surface of an X-cut $LiTaO_3$ substrate.

FIG. 6 shows a Smith chart for an X-cut LiTaO₃ single crystal substrate on which the direction θ of propagation of acoustic waves is 115° measured from the Y-axis. It is seen that the electrical energy is converted into the mechanical energy at the center frequency of 165 MHz and that the unwanted waves appear at 307 MHz.

Figure 7:
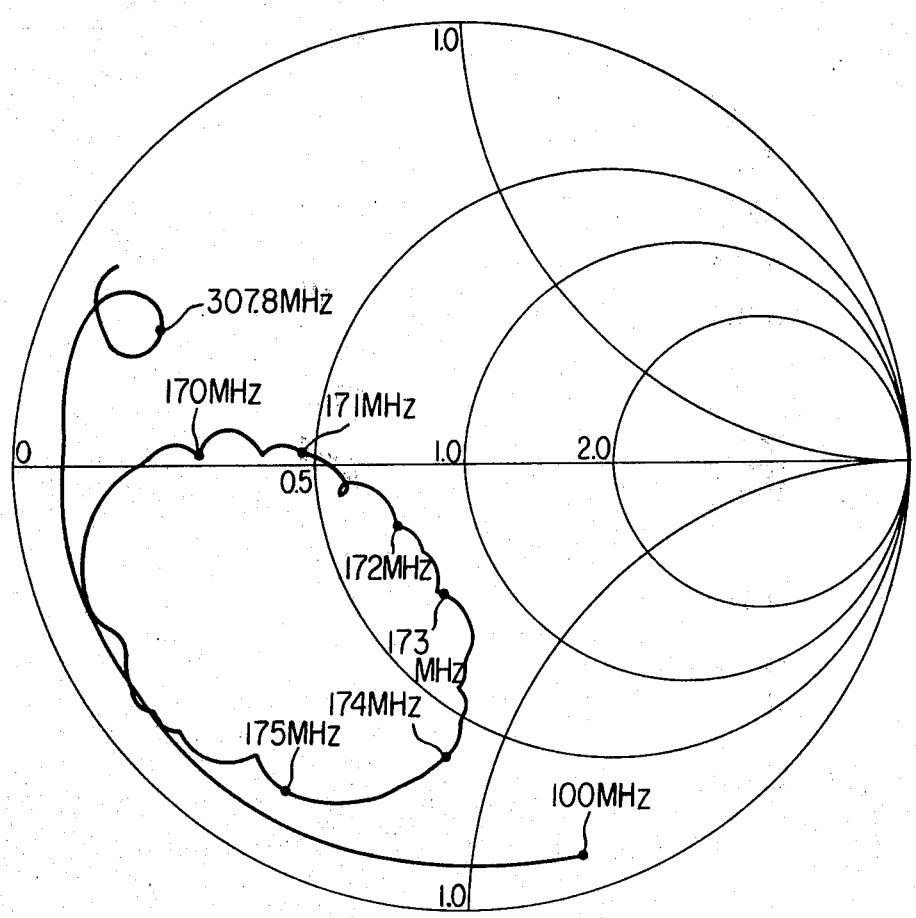
FIG. 7 is a Smith chart for a composite device consisting of an X-cut $LiTaO_3$ substrate and a $SiO_2$ film of 3 μm in thickness thereon.

FIG. 7 shows a Smith chart for an X-cut LiTaO₃ single crystal substrate coated with a SiO₂ film of 3 μm in thickness. It is seen that as compared with FIG. 6, the impedance change is pronounced.

Figure 8:
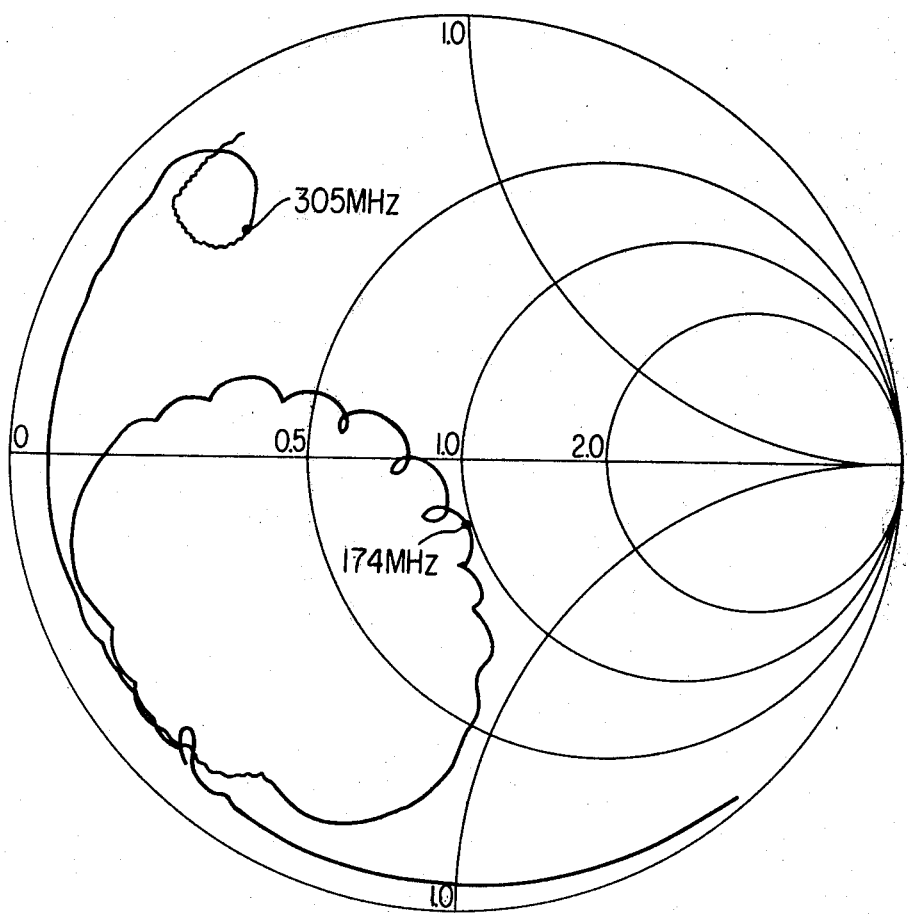
FIG. 8 is a Smith chart for a composite device consisting of an X-cut LiTaO₃ substrate and a SiO₂ film of 6 μm in thickness thereon.

FIG. 8 shows a Smith chart for an X-cut LiTaO₃ single crystal substrate coated with a SiO₂ film thicker than the SiO₂ film of the device shown in FIG. 7; that is, the substrate coated with the SiO₂ film of 6 μm. It is seen that the coupling coefficient is higher than that shown in FIG. 7.

In general, the two-layer structures have the problem that in addition to the wanted surface acoustic waves, the unwanted waves in various modes appear. As is seen from FIGS. 6, 7 and 8, the unwanted waves are extremely small as compared with the wanted waves at the thickness of 3.3 μm of the SiO₂ film at which the temperature coefficient is zero. Thus, the unwanted waves are negligible in practice.

Figure 9:
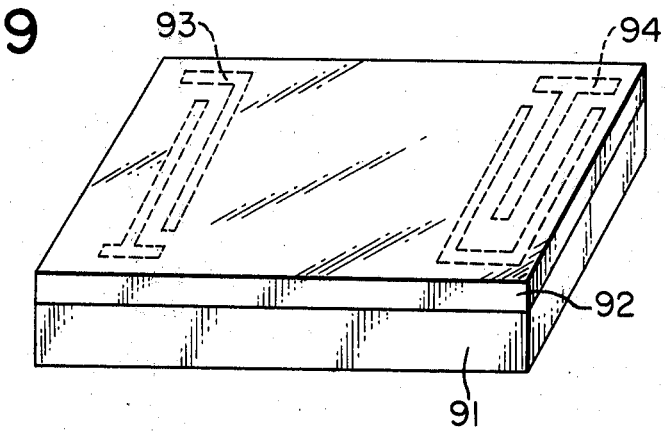
FIG. 9 is a perspective view of a composite surface acoustic wave device in accordance with the present invention which is operated as a delay line or a bandpass filter.

Referring next to FIG. 9, a delay line or a bandpass filter consisting of a surface acoustic wave device consisting of an X-cut LiTaO₃ substrate coated with a SiO₂ film will be described. In FIG. 9, reference numeral 91 represents an X-cut LiTaO₃ single crystal substrate and 92, a SiO₂ film of 3.0 μm in thickness. Fifty pairs of input and output interdigital electrodes 93 and 94 are provided. The wavelength is 20 μm. The propagation distance between the input and output electrodes is 5 mm.

When the surface acoustic wave device shown in FIG. 9 is used as a delay line, the delay time provided is 1.4 micro-seconds (=5 (mm)÷3400 (m/sec)); that is, the time required for the surface acoustic wave generated at the input interdigital electrode 93 to propagate the distance of 5 mm. With a plurality of output electrodes or output circuits, a tapped delay line may be provided.

Figure 11:
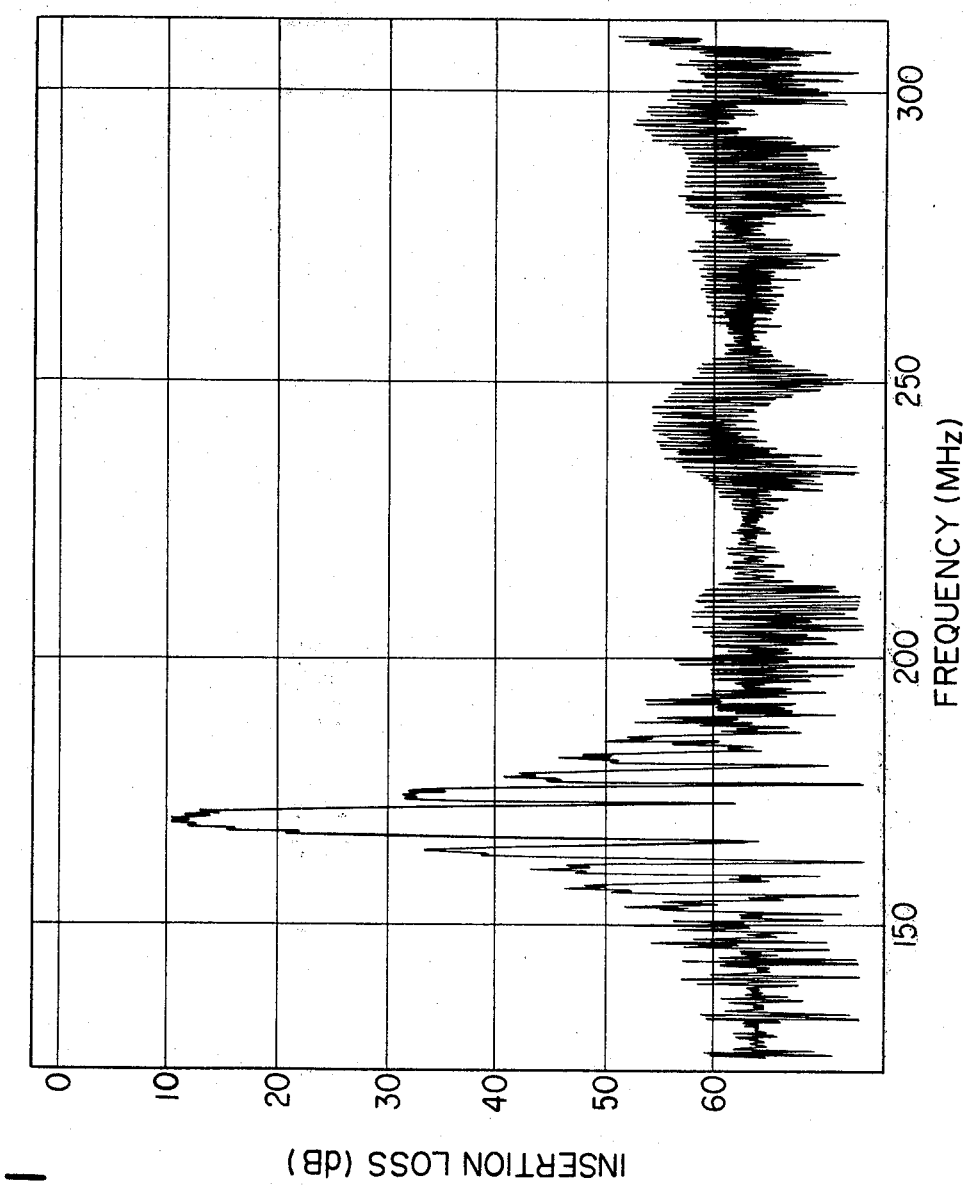
FIG. 11 shows the transmission characteristic of the bandpass filter in FIG. 9.

The characteristic of a bandpass filter with the input and output interdigital electrodes of 50 fingers and of intersection width or interleaving length of 1 mm is shown in FIG. 11. It is seen that the filter exhibits an excellent transmission characteristic at about 170 MHz.

The delay lines, bandpass filters of the types described above and the oscillators to be described below must have a zero temperature coefficient.

Figure 10:
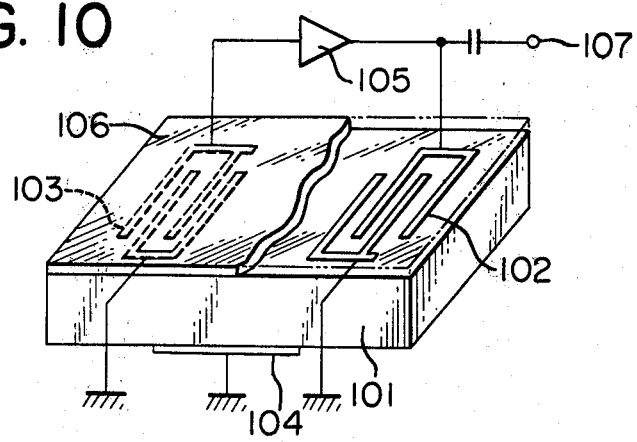
FIG. 10 is a perspective view of an oscillator using a composite surface acoustic wave device consisting of an X-cut LiTaO₃ substrate and a SiO₂ film thereon.

In FIG. 10 is shown an oscillator with an X-cut LiTaO$_3$ single crystal substrate 101. Surface acoustic wave input and output interdigital electrodes 102 and 103 are formed on one major surface of the substrate 101 and a grounding electrode 104 is formed on the other major surface thereof. The input and output interdigital electrodes 102 and 103 are electrically connected to each other through an amplifier 105. The portions of the input and output interdigital electrodes 102 and 103 are grounded. A SiO$_2$ film 106 is formed over one major surface of the substrate 101. The surface acoustic waves generated at the input interdigital electrode 102 are propagated along one major surface of the substrate 101 to the output interdigital electrode 103. The output from the output interdigital electrode 103 is amplified by the amplifier 105 and is applied again to the input interdigital electrode 102 so that the surface acoustic waves are excited and subsequently oscillations result. Part of the oscillation output is derived from an output terminal 107.

Figure 12:
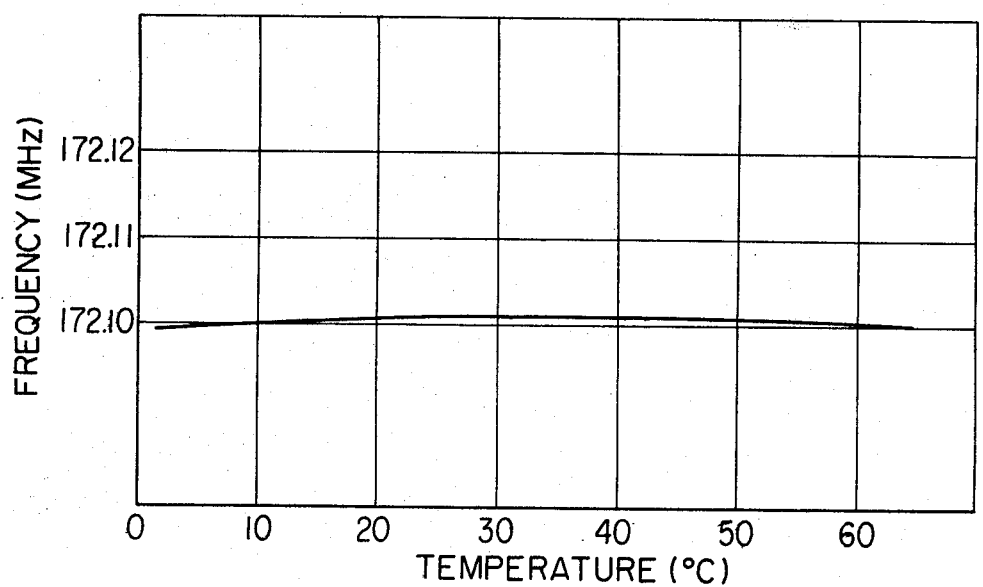
FIG. 12 shows the oscillation frequency vs. temperature characteristic thereof.

FIG. 12 shows the frequency-temperature characteristic of an oscillator with an X-cut LiTaO$_3$ substrate with a SiO$_2$ film overlay and with the direction $\theta$ of propagation of 115° measured from the Y-axis to the Z-axis. It is seen that the frequency change is less than 10 ppm. It is possible only with the surface acoustic wave materials in accordance with the present invention to provide the oscillator capable of oscillating with an extremely higher degree of frequency stability over a wide temperature range. The oscillators using an AT-cut quartz have been devised and demonstrated at present, but they are disadvantageous in that extremely complex circuits are needed in order to prevent the irregular shift in oscillation frequency. However, such complex circuits can be eliminated with the surface acoustic wave devices in accordance with the present invention.

Referring back to FIG. 9, the interdigital electrodes 93 and 94 are shown as being sandwiched between the X-cut LiTaO$_3$ single crystal substrate 91 and the SiO$_2$ film 92, but it is to be understood that an SiO$_2$ film is first overlayed over an X-cut LiTaO$_2$ single crystal substrate and then interdigital electrodes are formed over the SiO$_2$ film.

Next, the relationship between the direction of propagation of surface acoustic waves and the angle $\theta$ measured from the Y-axis will be described. On a Y-cut LiTaO$_3$ substrate, the temperature coefficient change is 35 to 45 ppm while on an X-cut LiTaO$_3$ substrate the temperature coefficient change is from 24 to 54 ppm.

That is, the latter's change is greater than the former's. In general, because of anisotropy of crystals, the direction of propagation of surface acoustic waves is different very often from the direction of propagation of sound energy. Assume that on the surface of an X-cut LiTaO$_3$ substrate, the tolerance of the power angle; that is, the angle between the direction in which the waves are propagated and the direction in which the acoustic energy is propagated be within 2°. Then, the angle $\theta$ becomes between 80° and 180° and the temperature coefficient change becomes from 20 to 30 ppm, which is smaller than 35 ppm in the case of a Y-cut LiTaO$_3$ substrate. Thus both the temperature coefficient change and the power flow angle are taken in consideration in determining the angle $\theta$ which is between 80° and 180°. Then, the zero temperature coefficient can be obtained with a SiO$_2$ film whose thickness is smaller than the wave length of the surface acoustic wave propagated along the surface of a Y-cut LiTaO$_3$ substrate.

So far it has been described that with the X-cut LiTaO$_3$ substrates, the zero temperature coefficient can be obtained. For a better long-term stability, it is preferable that an SiO$_2$ film is formed at temperatures as low as possible. The optimum process available at present for forming the SiO$_2$ film at low temperatures is a magnetron sputtering process in which a holder for supporting a LiTaO$_3$ is cooled, so that adverse affects resulting from reverse sputtering can be circumvented. Thus, the SiO$_2$ films can be formed at temperatures ranging from 25° to 150° C. The inventors found out that under these conditions, the frequency change due to distortions in the composite structure of the SiO$_2$ film and the LiTaO$_3$ substrate can be minimized.

At present, the surface acoustic wave devices have been increasingly used in various fields. These devices must have a higher degree of stability, especially a higher degree stability in temperature coefficient change. So far the ST-cut quartz has been a typical material with the zero temperature coefficient, but the X-cut LiTaO$_3$ substrate—SiO$_2$ film composite devices in accordance with the present invention have a high temperature coefficient stability increased by one order of magnitude over a wide temperature range from −20° to +60° C. as compared with the prior art ST-cut quartz. In addition, the surface acoustic wave devices in accordance with the present invention has a high coupling coefficient which is from 10 to 20 times as high as that of the ST-cut quartz. Thus, the surface acoustic wave devices in accordance with the present invention will find wide applications in various field, especially in oscillators, filters, delay lines and so on which must operate with a higher degree of stability in the VHF and UHF ranges.

What is claimed is:

1. A surface acoustic wave device comprising
    an X-cut LiTaO$_3$ single crystal substrate,
    a SiO$_2$ film formed over one major surface of said substrate, and
    interdigital electrodes formed over said major surface and oriented such that the direction of propagation of surface acoustic waves is between 80° and 180° measured from the Y-axis toward the Z-axis.

2. A surface acoustic wave device as set forth in claim 1 further characterized in that the product h.k is between 0.6 and 3.0, where h is the thickness of the SiO$_2$ film and k is equal to $2\pi/\lambda$ where $\lambda$ is acoustic wave length.

3. A delay line device comprising an X-cut LiTaO₃ single crystal substrate,
   interdigital electrodes formed over one major surface of said substrate,
   a SiO₂ film formed over said one major surface of said substrate and said interdigital electrodes formed on said SiO₂ film, and
   said electrodes being oriented such that the direction of propagation of surface acoustic waves is between 80° and 180° measured from the Y-axis toward the Z-axis.

4. A delay line device comprising an X-cut LiTaO₃ single crystal substrate,
   a SiO₂ film formed over said one major surface of said substrate,
   interdigital electrodes formed on said SiO₂ film, and
   said electrodes being oriented such that the direction of propagation of surface acoustic waves is between 80° and 180° measured from the Y-axis toward the Z-axis.

5. A delay line device as set forth in claim 3 or claim 4 further characterized in that the product h.k is between 0.6 and 3.0, where h is the thickness of said SiO₂ film and k is equal to $2\pi/\lambda$ where $\lambda$ is acoustic wave length.

6. A bandpass filter comprising an X-cut LiTaO₃ single crystal substrate,
   interdigital electrodes formed on one major surface of said substrate,
   a SiO₂ film formed over said one major surface of said substrate and said interdigital electrodes thereon, and
   said electrodes being oriented such that the direction of propagation of surface acoustic waves is between 80° and 180° measured from the Y-axis toward the Z-axis.

7. A bandpass filter comprising an X-cut LiTaO₃ single crystal substrate,
   a SiO₂ film formed over said one major surface of said substrate,
   interdigital electrodes formed on said SiO₂ film, and
   said electrodes being oriented such that the direction of propagation of surface acoustic waves is between 80° and 180° measured from the Y-axis toward the Z-axis.

8. A bandpass filter as set forth in claim 6 or claim 7 further characterized in that the product h.k is between 0.6 and 3.0, where h is the thickness of said SiO₂ film and k is equal to $2\pi/\lambda$ where $\lambda$ is acoustic wave length.

9. An oscillator comprising an X-cut LiTaO₃ single crystal substrate,
   interdigital electrodes formed on one major surface of said substrate,
   a SiO₂ film formed over said one major surface of said substrate and said interdigital electrodes thereon,
   a connecting means for electrically interconnecting between the input and output of said interdigital electrodes, and
   said electrodes being oriented such that the direction of propagation of surface acoustic waves is between 80° and 180° measured from the Y-axis toward the Z-axis.

10. An oscillator comprising an X-cut LiTaO₃ single crystal substrate,
    a SiO₂ film formed over said one major surface of said substrate,
    interdigital electrodes formed on said SiO₂ film,
    a connecting means for electrically interconnecting the input to output of said interdigital electrodes, and
    said electrodes being oriented such that the direction of propagation of surface acoustic waves is between 80° and 180° measured from the Y-axis toward the Z-axis.

11. An oscillator as set forth in claim 9 or claim 10 further characterized in that the product h.k is between 0.6 and 3.0, where h is the thickness of said SiO₂ film and k is equal to $2\pi/\lambda$ where $\lambda$ is acoustic wave length.

* * * * *